(12) United States Patent
He et al.

(10) Patent No.: US 11,508,786 B2
(45) Date of Patent: Nov. 22, 2022

(54) DISPLAY BACKPLANE, METHOD OF MANUFACTURING THE SAME AND DISPLAY DEVICE USING THE SAME

(71) Applicant: BOE TECHNOLOGY GROUP CO., LTD., Beijing (CN)

(72) Inventors: Jiayu He, Beijing (CN); Xue Liu, Beijing (CN); Zhengliang Li, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 94 days.

(21) Appl. No.: 16/835,722

(22) Filed: Mar. 31, 2020

(65) Prior Publication Data
US 2021/0167143 A1 Jun. 3, 2021

(30) Foreign Application Priority Data
Nov. 28, 2019 (CN) .......................... 201911195069.3

(51) Int. Cl.
*H01L 27/32* (2006.01)
*H01L 31/105* (2006.01)
(Continued)

(52) U.S. Cl.
CPC ...... *H01L 27/3227* (2013.01); *H01L 27/3258* (2013.01); *H01L 27/3262* (2013.01);
(Continued)

(58) Field of Classification Search
CPC .............. H01L 27/3227; H01L 27/3258; H01L 27/3262; H01L 31/105; H01L 31/18;
(Continued)

(56) References Cited

U.S. PATENT DOCUMENTS

2007/0273292 A1* 11/2007 Choi ................. H01L 31/03682
315/158
2008/0290393 A1* 11/2008 Kakehata .............. H01L 27/115
257/316
(Continued)

FOREIGN PATENT DOCUMENTS

CN 103839970 A 6/2014
CN 103928474 A 7/2014
(Continued)

OTHER PUBLICATIONS

First Office Action for CN Patent Application No. 201911195069.3 dated Dec. 2, 2021.
(Continued)

*Primary Examiner* — S M Sohel Imtiaz
(74) *Attorney, Agent, or Firm* — Xsensus LLP

(57) ABSTRACT

The disclosure provides a display backplane, a method of manufacturing the same, and a display device using the same. The display backplane includes a substrate; a thin film transistor structure layer disposed on one side of the substrate and including thin film transistors, a gate insulating layer, and an interlayer dielectric layer, where an etching rate of the interlayer dielectric layer carried out under an HF atmosphere condition is less than 2 Å/S; and photosensitive devices spaced apart from the thin film transistor structure layer and disposed on one side of the thin film transistor structure layer away from the substrate. The interlayer dielectric layer has a high compactness, and can effectively block H from entering the active layer of the thin film transistor to conductorize the active layer, thus guaranteeing good optical characteristics of the thin film transistor while carrying out optical compensation.

12 Claims, 13 Drawing Sheets

(51) Int. Cl.
*H01L 31/18* (2006.01)
*H01L 27/12* (2006.01)

(52) U.S. Cl.
CPC ............ *H01L 31/105* (2013.01); *H01L 31/18* (2013.01); *H01L 27/1248* (2013.01); *H01L 2227/323* (2013.01)

(58) Field of Classification Search
CPC ........... H01L 27/1248; H01L 2227/323; H01L 27/3272; H01L 27/3269; H01L 27/1214; Y02P 70/50
See application file for complete search history.

(56) References Cited

U.S. PATENT DOCUMENTS

| | | | | |
|---|---|---|---|---|
| 2012/0267611 | A1* | 10/2012 | Chung | H01L 27/3272 257/40 |
| 2017/0012087 | A1* | 1/2017 | Seo | H01L 51/5221 |
| 2017/0278909 | A1* | 9/2017 | Jeon | A61B 5/14552 |
| 2018/0150670 | A1* | 5/2018 | Jang | H01L 27/323 |
| 2019/0340409 | A1* | 11/2019 | Zhu | G06K 9/00006 |
| 2019/0341489 | A1 | 11/2019 | Chi et al. | |
| 2020/0058680 | A1* | 2/2020 | Liu | H01L 27/13 |
| 2020/0105841 | A1* | 4/2020 | Bang | H01L 31/105 |
| 2020/0161402 | A1* | 5/2020 | Wang | H01L 27/1225 |

FOREIGN PATENT DOCUMENTS

| | | | | |
|---|---|---|---|---|
| CN | 105244383 | A | | 1/2016 |
| CN | 107591410 | A | | 1/2018 |
| CN | 108336100 | A | * | 7/2018 ......... H01L 27/1288 |
| CN | 108376688 | A | | 8/2018 |
| CN | 108766987 | A | | 11/2018 |
| CN | 108766989 | A | | 11/2018 |
| CN | 108878503 | A | | 11/2018 |
| CN | 109144311 | A | | 1/2019 |
| CN | 109285870 | A | | 1/2019 |
| CN | 109728050 | A | | 5/2019 |
| CN | 109786470 | A | | 5/2019 |

OTHER PUBLICATIONS

Tianze Li, et al., "A new structure study of position sensitive detector," The Institute of Optics and Electronics, Shandong University of Technology (2012).

* cited by examiner

DISPLAY BACKPLANE, METHOD OF MANUFACTURING THE SAME AND DISPLAY DEVICE USING THE SAME

CROSS REFERENCE TO RELATED APPLICATIONS

This application claims the benefit of and priority to Chinese Patent Application No. 201911195069.3 filed on Nov. 28, 2019, the contents of which being hereby incorporated by reference in their entirety herein.

TECHNICAL FIELD

The disclosure relates to the field of display technology and, more particularly, to a display backplane, a method of manufacturing the same, and a display device using the same.

BACKGROUND

Organic light-emitting diode (OLED) display products are becoming increasingly mature after their development for quite a long time, and they are developing rapidly recently and have been gradually used in terminal products. Nowadays, OLEDs still have some technical problems, such as a compensation method. A common compensation method is electrical compensation, but it has limited effect. An optical compensation method has been proposed in related art, and specifically, the corresponding compensation is performed by a method by incorporating photosensitive devices in pixels to sense a luminous intensity of the OLED and feeding back signals detected by the photosensitive devices to the OLED.

SUMMARY

The disclosure aims to solve one of the technical problems in the related technology at least to some extent. For this reason, it is an object of the disclosure to provide a display backplane that can carry out optical compensation and allow perfect electrical properties of a thin film transistor.

In one aspect of the disclosure, the disclosure provides a display backplane. According to an embodiment of the disclosure, the display backplane includes: a substrate; a thin film transistor structure layer disposed on one side of the substrate and including a plurality of thin film transistors, a gate insulating layer, and an interlayer dielectric layer, wherein an etching rate of the interlayer dielectric layer carried out under an HF atmosphere condition is less than 2 Å/S; and a plurality of photosensitive devices spaced apart from the thin film transistor structure layer and disposed on one side of the thin film transistor structure layer away from the substrate.

According to an embodiment of the disclosure, the photosensitive device includes a first electrode, a photosensitive sensor, and a second electrode that are stacked up, the first electrode is disposed near the substrate, wherein an orthographic projection of the photosensitive sensor on the substrate falls within an orthographic projection of the first electrode on the substrate, and there is a gap between an edge of the orthographic projection of the first electrode on the substrate and an edge of the orthographic projection of the photosensitive sensor on the substrate, and a width of the gap is equal to or greater than 7 microns.

According to an embodiment of the disclosure, an orthographic projection of a source electrode of source and drain electrodes in the thin film transistor under the photosensitive device on the substrate and the orthographic projection of the photosensitive sensor on the substrate overlap each other partially, and a gap between an orthographic projection of an edge line on one side of the source electrode away from a drain electrode in the source and drain electrodes on the substrate and an orthographic projection of an edge line on one side of the photosensitive sensor away from the drain electrode on the substrate is equal to or greater than 7 microns.

According to an embodiment of the disclosure, an orthographic projection of the drain electrode of the source and drain electrodes in the thin film transistor under the photosensitive device on the substrate and the orthographic projection of the photosensitive sensor on the substrate overlap each other partially, and a gap between an orthographic projection of an edge line on one side of the drain electrode away from the source electrode of the source and drain electrodes on the substrate and an orthographic projection of an edge line on one side of the photosensitive sensor away from the source electrode on the substrate is equal to or greater than 7 microns.

According to an embodiment of the disclosure, a plurality of spaced-apart sub-pixels are disposed on the display backplane, the photosensitive devices are disposed at gaps among the plurality of sub-pixels, the photosensitive devices are in an elongated shape, and a plurality of sub-pixels are respectively distributed on both sides of the photosensitive devices in a width direction thereof.

According to an embodiment of the disclosure, the photosensitive sensor is a PIN-type photodiode.

According to an embodiment of the disclosure, the display backplane further includes: an organic barrier layer, disposed between the thin film transistor structure layer and the photosensitive device, and an orthographic projection of the organic barrier layer on the substrate covers the orthographic projection of the photosensitive sensor on the substrate.

According to an embodiment of the disclosure, the organic barrier layer includes a plurality of sub-organic barrier layers and an orthographic projection of each of the sub-organic barrier layers on the substrate covers an orthographic projection of one of the photosensitive sensors on the substrate.

According to an embodiment of the disclosure, the organic barrier layer is an integral layer structure and an orthographic projection of the organic barrier layer of the integral layer structure on the substrate covers orthographic projections of the plurality of photosensitive sensors on the substrate.

According to an embodiment of the disclosure, a surface of the organic barrier layer away from the substrate is a flat plane.

According to an embodiment of the disclosure, the organic barrier layer meets at least one of the following conditions: a curing temperature lower than 260 degrees Celsius; and a thermal decomposition temperature greater than 450 degrees Celsius.

According to an embodiment of the disclosure, the organic barrier layer is made of at least one of a polyimide-based material and a silicone-based material.

According to an embodiment of the disclosure, the organic barrier layer is in an elongated shape, an orthographic projection of a long side of the organic barrier layer on the substrate is between an orthographic projection of a side of the source and drain electrodes adjacent to the long side of the organic barrier layer on the substrate and an orthographic projection of a long side of the first electrode on the substrate, and an orthographic projection of a short side of the organic barrier layer on the substrate is between an orthographic projection of a short side of the first electrode on the substrate and an orthographic projection of a short side of the second electrode on the substrate.

According to an embodiment of the disclosure, the display backplane further includes a second inorganic insulating layer disposed on one side of the organic barrier layer away from the substrate.

In another aspect of the disclosure, a method of manufacturing a display backplane is provided where the display backplane includes: a substrate; a thin film transistor structure layer disposed on one side of the substrate and including a plurality of thin film transistors, a gate insulating layer, and an interlayer dielectric layer, wherein an etching rate of the interlayer dielectric layer carried out under an HF atmosphere condition is less than 2 Å/S; and a plurality of photosensitive devices spaced apart from the thin film transistor structure layer and disposed on one side of the thin film transistor structure layer away from the substrate, and the method includes: forming a thin film transistor structure layer on a substrate; forming a photosensitive device on one side of the thin film transistor structure layer away from the substrate, wherein the interlayer dielectric layer in the thin film transistor structure layer is formed by a deposition manner and the deposition manner meets at least one of the following conditions: a deposition power is 1000-1500 W; a deposition pressure is 1800-2400 mtorr; and deposition time is 220~280 s. In this method, the interlayer dielectric layer will have high compactness by adjusting the parameters for forming the interlayer dielectric layer. Therefore, when the photosensitive device is formed, H in a reaction atmosphere can be effectively blocked by the interlayer dielectric layer from entering an active layer in a thin film transistor, which effectively alleviates the problem of large current of the thin film transistor.

According to an embodiment of the disclosure, after forming the thin film transistor structure layer and before forming the photosensitive device, the method further includes forming an organic barrier layer on one side of the thin film transistor structure layer away from the substrate.

According to an embodiment of the disclosure, after forming the organic barrier layer and before forming the photosensitive device, the method further includes forming a second inorganic insulating layer on one side of the organic barrier layer away from the substrate.

In yet another aspect of the disclosure, the disclosure provides a display backplane that includes: a substrate; a thin film transistor structure layer disposed on one side of the substrate; a photosensitive device disposed on one side of the thin film transistor structure layer away from the substrate and including a photosensitive sensor; and an organic barrier layer disposed between the thin film transistor structure layer and the photosensitive device, and an orthographic projection of the organic barrier layer on the substrate covers the orthographic projection of the photosensitive sensor on the substrate.

In yet another aspect of the disclosure, the disclosure provides a display device including the above display backplane.

DETAILED DESCRIPTION

Hereinafter, embodiments of the disclosure will be described in detail. The embodiments described below are exemplary and they are only intended to explain the disclosure, and should not be construed as limiting the disclosure. Please refer to technologies or conditions described in literatures in the art or product specifications if no specific technologies or conditions are indicated in the embodiments. Reagents or instrument used herein are conventional products that are commercially available if their manufacturers are not indicated.

Figure 8:
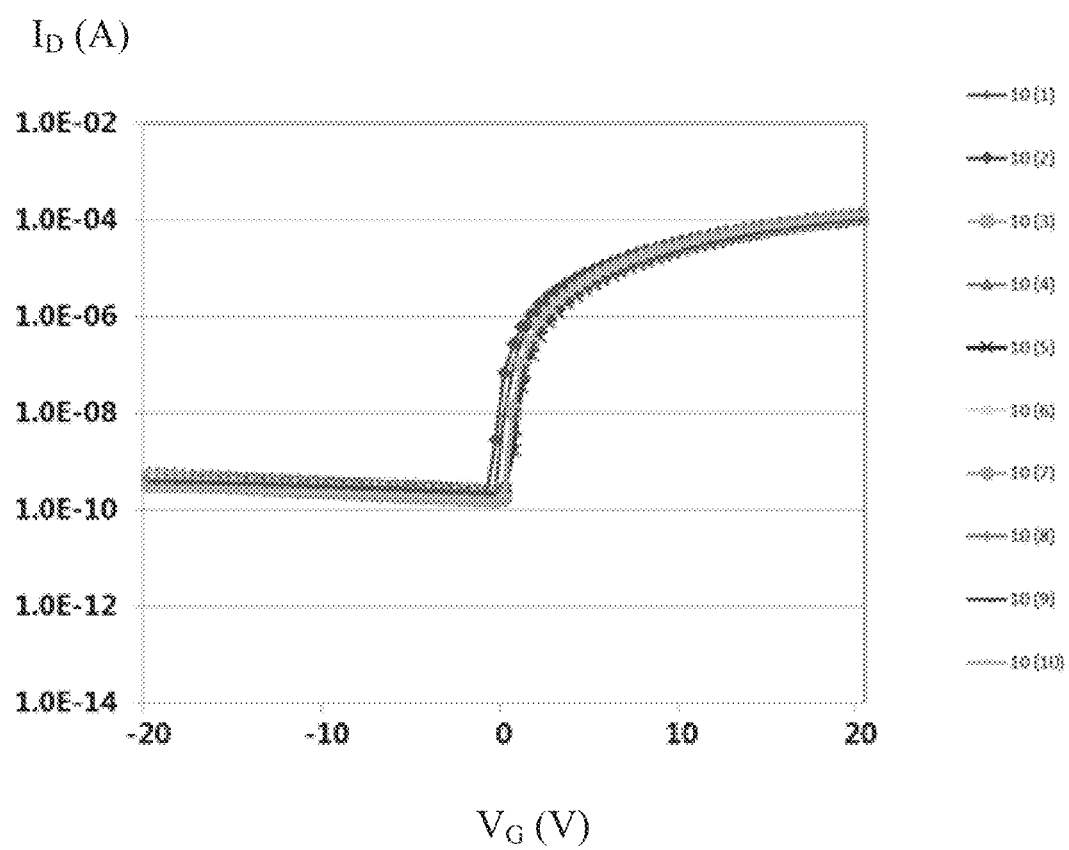
FIG. 8 is a view of $I_D$-$V_G$ curves of a thin film transistor before forming a photosensitive device in the related technology.
Figure 9:
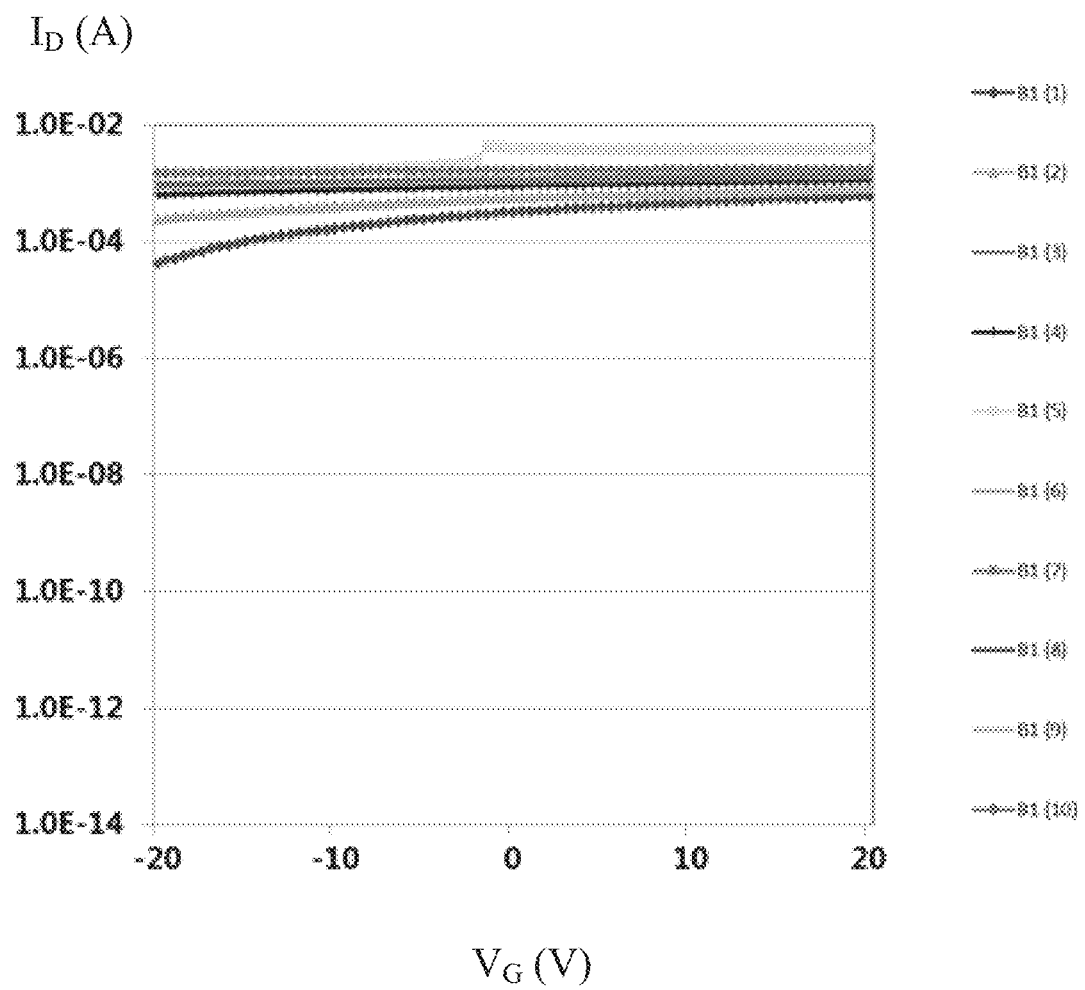
FIG. 9 is a view of $I_D$-$V_G$ curves of a thin film transistor after forming a photosensitive device in the related technology.

During research, the inventors of the disclosure found that after providing a photosensitive device for optical compensation, a thin film transistor in a display backplane, especially an oxide thin film transistor (that is, the active layer is a metal oxide semiconductor material), is basically in a large current state and the photosensitive device also has a large dark current when they are used, which seriously affects the service performance of the display backplane. The inventors has conducted in-depth study of the above-described problems, $I_D$-$V_G$ curves are plotted by detecting a drain current $I_D$ and a gate voltage $V_G$ of the thin film transistor before and after the formation of the photosensitive device ($I_D$-$V_G$ curves of the thin film transistor before the formation of the photosensitive device are shown in FIG. 8, and $I_D$-$V_G$ curves of the thin film transistor after the formation of the photosensitive device are shown in FIG. 9, where FIGS. 8 and 9 show $I_D$-$V_G$ characteristic curves plotted after different test points are tested, respectively). The inventors found that the large current of the thin film transistor is mainly due to the process of forming the photosensitive device, in which the deposition time is usually 10-30 minutes and deposition gases are mainly SiH$_4$ and H$_2$ (i.e., H atmosphere), in order to ensure the quality of a thin film and make the thin film thicker, and a metal oxide semiconductor in the thin film transistor is easily conductorized in the H atmosphere for 10-30 minutes, so its semiconductor property is weakened and its conductor property is enhanced, thereby bringing the thin film transistor basically into a large current state when they are used. Further, there are two reasons causing the dark current of the photosensitive device. On one hand, the dark current of the photosensitive device is caused by an uneven surface under the photosensitive device because the unevenness will cause cracks during film deposition, a thin film current is related to a compactness of a film structure, and low compactness will lead to cracking, so carrier transport will be blocked, thus increasing the dark current. On the other hand, the dark current of the photosensitive device is due to light leakage from a side wall of the photosensitive device. Based on the above-described research findings, the inventors have proposed an effective means through which H will be blocked and the dark current of the photosensitive device will be reduced.

Figure 10:
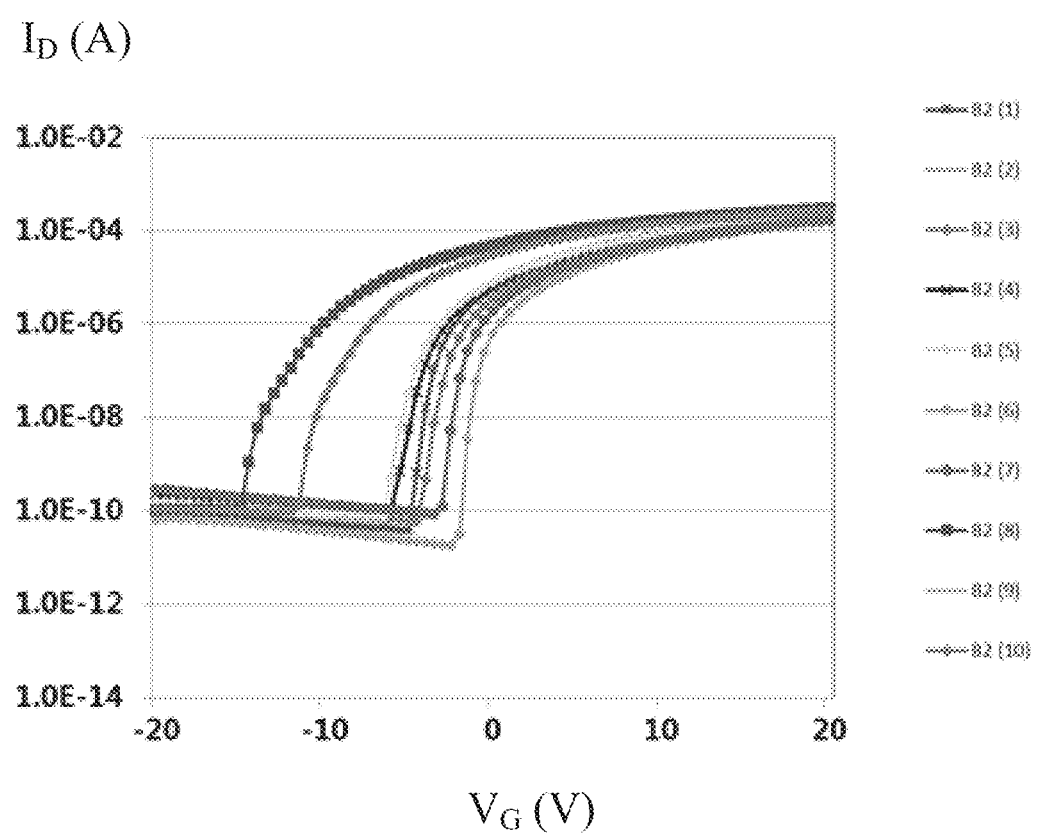
FIG. 10 is a view of $I_D$-$V_G$ curves of a thin film transistor after forming a photosensitive device according to an embodiment of the disclosure.

Specifically, in one aspect of the disclosure, the disclosure provides a display backplane. According to an embodiment of the disclosure, referring to FIG. 1, the display backplane includes a substrate 10; a thin film transistor structure layer 20 disposed on one side of the substrate 10 and including a plurality of thin film transistors, a gate insulating layer and an interlayer dielectric layer 26; and a plurality of photosensitive devices 30 spaced apart from the thin film transistor structure layer 20 and disposed on one side of the thin film transistor structure layer 20 away from the substrate. An etching rate of the interlayer dielectric layer 26 is less than 2 Å/S (specifically, it can be 1~2 Å/S, for example, 1 Å/S, 1.1 Å/S, 1.2 Å/S, 1.3 Å/S, 1.4 Å/S, 1.5 Å/S, 1.6 Å/S, 1.7 Å/S, 1.8 Å/S, 1.9 Å/S, 1.95 Å/S, etc.). The interlayer dielectric layer of the display backplane in the disclosure has a higher compactness than that of an interlayer dielectric layer of a conventional display backplane, which has an etching rate of about 5 Å/S. In the display backplane of the disclosure, the interlayer dielectric layer has high compactness, so the interlayer dielectric layer can effectively block H from entering the active layer of the thin film transistor to conductorize the active layer when the photosensitive devices are formed, thus avoiding bringing the thin film transistors into a large current state after the formation of the photosensitive devices when being used and guaranteeing good optical characteristics of the thin film transistors while carrying out optical compensation. After experimental verification, $I_D$-$V_G$ curves of the thin film transistors after the formation of the photosensitive devices are shown in FIG. 10 when the compactness of the interlayer insulating layer is increased (for its structural schematic diagram, please refer to FIG. 1). FIG. 10 is a view of $I_D$-$V_G$ characteristic curves drawn after different test points are tested.

It should be noted that the etching rate described herein refers to an etching rate at which dry etching is carried out under an HF atmosphere condition.

Figure 1:
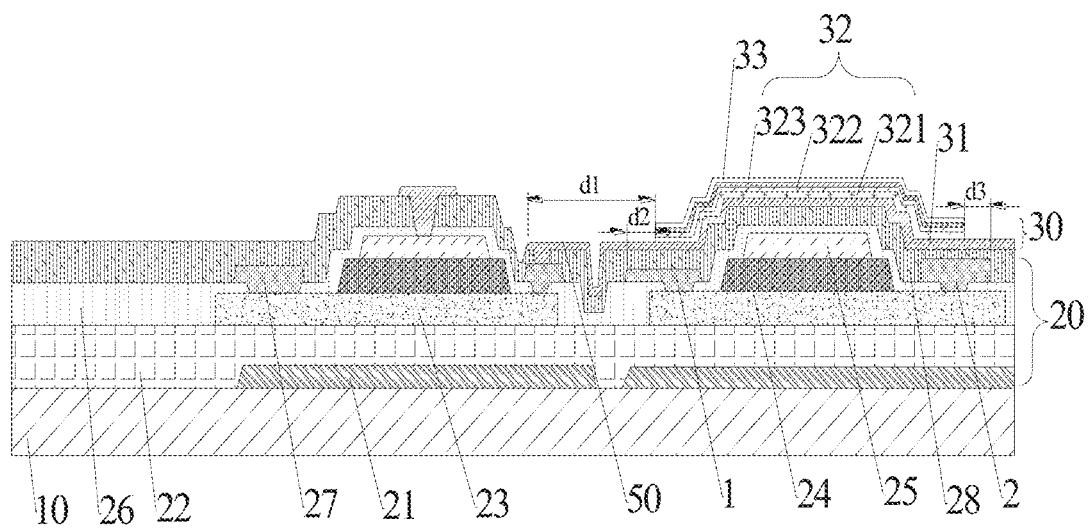
FIG. 1 is a cross-sectional view of a display backplane according to an embodiment of the disclosure.

It should be understood by those skilled in the art that the thin film transistor structure layer described herein may include a plurality of thin film transistors for the driving of display (each thin film transistor may include a gate electrode, an active layer and source and drain electrodes, etc.) and insulating layers (specifically including a gate insulating layer and an interlayer dielectric layer, etc.) disposed in the structure of the thin film transistors. In some specific embodiments, the thin film transistor structure layer may further include a light-shielding layer and a buffer layer disposed between the substrate and the thin film transistors and a first inorganic insulating layer disposed on one side of the thin film transistors away from the substrate. Specifically, referring to FIG. 1, the thin film transistor structure layer may include a light-shielding layer 21, a buffer layer 22, an active layer 23, a gate insulating layer 24, a gate electrode 25, an interlayer dielectric layer 26, source and drain electrodes 27 and a first inorganic insulating layer 28. It should be noted that the thin film transistor structure layer shown in FIG. 1 is only provided as a specific example for explanation and cannot be interpreted as a limitation on the disclosure. Other structures that do not depart from the concept of the disclosure also fall into the protection scope of the disclosure.

According to an embodiment of the disclosure, specific material, thickness, and size of the substrate can be flexibly selected according to actual demand and product specifications. In some embodiments, the substrate may be a glass substrate or a polymer substrate (such as a flexible PI (polyimide) substrate). The specific material and thicknesses of the light-shielding layer, the buffer layer, the active layer, the gate insulating layer, the gate electrode, the interlayer dielectric layer, the source and drain electrodes, and the first inorganic insulating layer can be flexibly selected according to needs and product specifications. For example, the material of the light-shielding layer may be a metal with good light-shielding performance. The material of the active layer may be a metal oxide semiconductor material. The material of the gate insulating layer, the interlayer dielectric layer and the first inorganic insulating layer may be silicon dioxide, silicon nitride, etc., respectively. The material of the gate electrode and the source and drain electrodes may be a metal with good conductivity.

According to an embodiment of the disclosure, referring to FIG. 1, the photosensitive device 30 may include a first electrode 31, a photosensitive sensor 32, and a second electrode 33 that are stacked up. The first electrode 31 is disposed near the substrate 10. Further, there is no particular limitation on the specific type of the photosensitive sensor, so long as it can detect intensity of light emitted from an OLED device and feed it back to a corresponding control circuit to carry out optical compensation for the OLED device. In some specific embodiments, the photosensitive sensor 32 may be a PIN-type photodiode. Specifically, referring to FIG. 1, the PIN-type photodiode may include an n-type semiconductor layer 321 disposed on a surface of the first electrode away from the substrate, an intrinsic semiconductor layer 322 disposed on a surface of the n-type semiconductor layer away from the substrate and a p-type semiconductor layer 323 disposed on a surface of the intrinsic semiconductor layer away from the substrate. In some specific embodiments, the intrinsic semiconductor layer may be lightly doped, so that the PIN-type photodiode has better photosensitivity.

According to an embodiment of the disclosure, in order to prevent ambient light from causing interference with the photosensitive device and thus affecting signal-to-noise ratio, in some specific embodiments, referring to FIG. 1, an orthographic projection of the photosensitive sensor 32 on the substrate 10 falls within an orthographic projection of the first electrode 31 on the substrate 10. Moreover, there is a gap between an edge of the orthographic projection of the first electrode 31 on the substrate 10 and an edge of the orthographic projection of the photosensitive sensor 32 on the substrate 10. A width d1 of the gap is equal to or greater than 7 microns (specifically, 7 microns, 8 microns, 9 microns, 10 microns, 11 microns, 12 microns, 13 microns, 14 microns, 15 microns, etc.). Therefore, the ambient light will hardly affect photocurrent and the photosensitive device will have a high signal-to-noise ratio and small dark current.

According to an embodiment of the disclosure, interference with the photosensitive device caused by the ambient light may be avoided by the source and drain electrodes in the thin film transistor in addition to the first electrode. In some specific embodiments, referring to FIG. 1, an orthographic projection of a source electrode 1 of the source and drain electrodes in the thin film transistor under the photosensitive device 30 on the substrate and an orthographic projection of the photosensitive sensor 32 on the substrate overlap each other partially. A width d2 of a gap between an orthographic projection of an edge line on one side of the source electrode 1 away from a drain electrode 2 in the source and drain electrodes on the substrate and an orthographic projection of an edge line on one side of the photosensitive sensor 32 away from the drain electrode 2 on the substrate is equal to or greater than 7 microns (specifically, 7 microns, 8 microns, 9 microns, 10 microns, 11 microns, 12 microns, 13 microns, 14 microns, 15 microns, etc.).

In other specific embodiments, referring to FIG. 1, an orthographic projection of the drain electrode 2 of the source and drain electrodes in the thin film transistor under the photosensitive device 30 on the substrate 10 and the orthographic projection of the photosensitive sensor 32 on the substrate 10 overlap each other partially. A width d3 of a gap between an orthographic projection of an edge line on one side of the drain electrode 2 away from the source electrode 1 of the source and drain electrodes on the substrate 10 and an orthographic projection of an edge line on one side of the photosensitive sensor 32 away from the source electrode 1 on the substrate 10 is equal to or greater than 7 microns (specifically, 7 microns, 8 microns, 9 microns, 10 microns, 11 microns, 12 microns, 13 microns, 14 microns, 15 microns, etc.).

Therefore, by covering the photosensitive sensor with the first electrode or the source and drain electrodes made of metal by at least 7 microns (that is, having the above gap with a width equal to or greater than 7 microns), the ambient light will hardly affect the photocurrent, so the signal-to-noise ratio of the photosensitive device will be high. Moreover, the dark current of the thin film transistor can be reduced, thus effectively ameliorating the problem of current of the thin film transistor. It should be noted that in the display backplane, the photosensitive sensor may be covered only with any one of the first electrode, the source electrode and the drain electrode. The photosensitive sensor may be covered with any two of the first electrode, the source electrode, and the drain electrode. The photosensitive sensor may also be covered with all of the first electrode, the source electrode, and the drain electrode. FIG. 1 only illustratively shows the case where the photosensitive sensor is covered with all of the first electrode, the source electrode, and the drain electrode, which should not be interpreted as a limitation on the disclosure.

Figure 4:
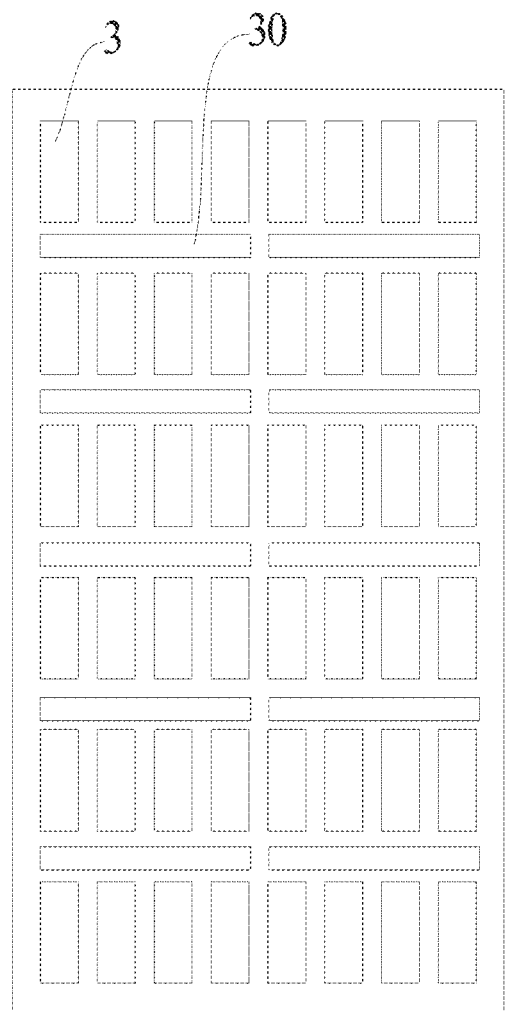
FIG. 4 is a plan view of a display backplane according to an embodiment of the disclosure.

It can be understood that, referring to FIG. 4, a plurality of spaced-apart sub-pixels 3 are disposed on the display backplane. An OLED device (specifically including a cathode and an anode that are disposed opposite to each other and an organic light-emitting layer disposed between the cathode and the anode) is disposed in each of the sub-pixels 3. The photosensitive device is used for sensing a light-emitting intensity of the OLED device to carry out optical compensation for the OLED device, and the photosensitive devices are dispersedly disposed on the display backplane to detect the light-emitting intensity of the OLED devices in different sub-pixels. Both effective optical compensation and the reduction of the dark current of the photosensitive device are realized. In some specific embodiments, referring to FIG. 4, the photosensitive devices 30 are disposed at gaps among the sub-pixels. The photosensitive devices 30 are in an elongated shape. A plurality of sub-pixels are respectively distributed on both sides of the photosensitive device 30 in its width direction. Specifically, the number of the sub-pixels provided on both sides of the photosensitive device 30 in its width direction may be 1 to 8, and specifically may be 1, 2, 3, 4 (see FIG. 4), 5, 6, 7, 8, etc. Therefore, one photosensitive device corresponds to a plurality of sub-pixels, which can significantly reduce the perimeter and the number of vertices of the photosensitive device and minimize the dark current of the photosensitive device.

Figure 2:
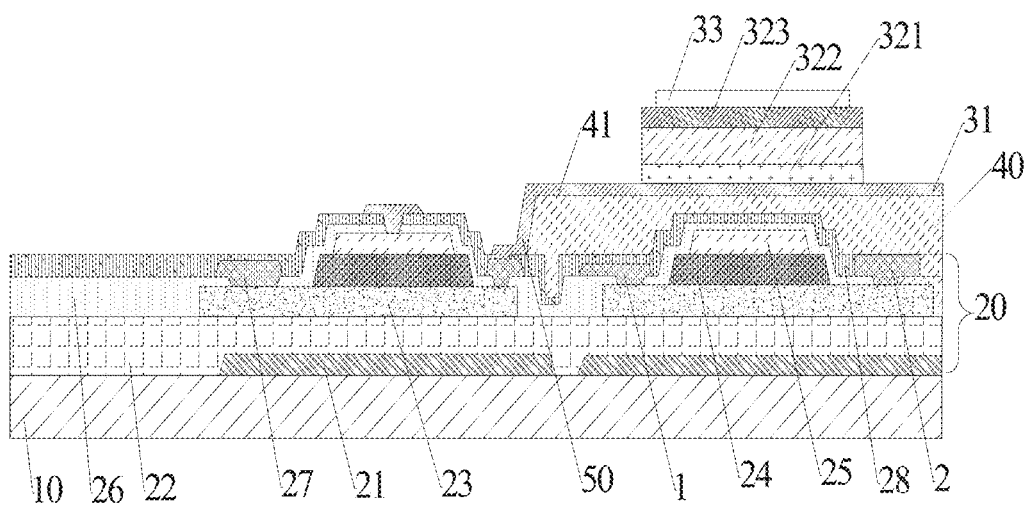
FIG. 2 is a cross-sectional view of a display backplane according to another embodiment of the disclosure.
Figure 11:
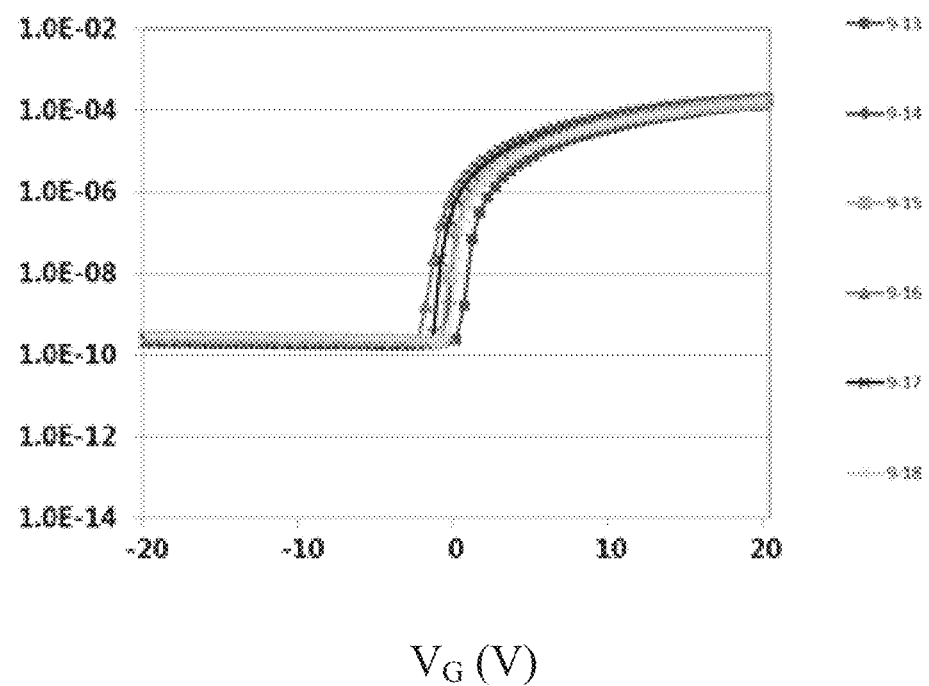
FIG. 11 is a view of $I_D$-$V_G$ curves of a thin film transistor after forming a photosensitive device according to another embodiment of the disclosure.
Figure 12:
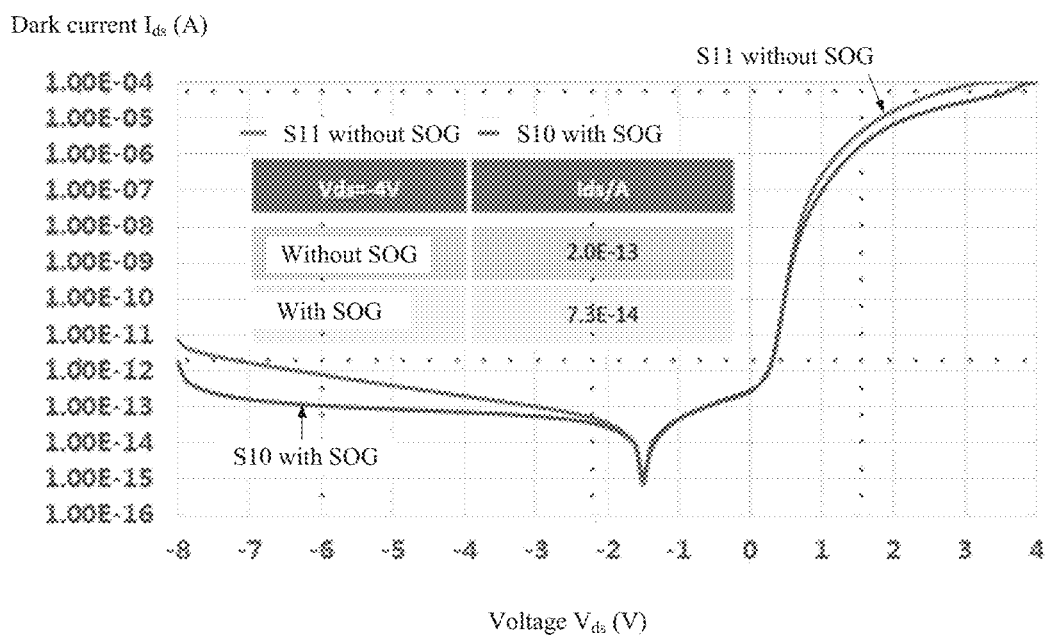
FIG. 12 is a comparison diagram illustrating test results of dark current of a photosensitive device in a display backplane in which an organic barrier layer is formed and in a display backplane in which no organic barrier layer is formed, according to an embodiment of the disclosure.

According to an embodiment of the disclosure, for further prevention of H atmosphere used at the time when the photosensitive device is formed from affecting the electrical properties of the thin film transistor, referring to FIG. 2, the display backplane may further include an organic barrier layer 40 disposed between the thin film transistor structure layer 20 and the photosensitive device 30. An orthographic projection of the organic barrier layer 40 on the substrate 10 covers the orthographic projection of the photosensitive sensor 32 on the substrate 10. By providing the organic barrier layer under the photosensitive device, it is possible to further block the H atmosphere used at the time when the photosensitive device is formed from entering the thin film transistor to affect the electrical properties of the thin film transistor, thus effectively ameliorating the problem of large current in the thin film transistor. After experimental verification, $I_D$-$V_G$ curves of the thin film transistor (for its structural schematic diagram, please refer to FIG. 2) after the formation of the photosensitive device with the organic barrier layer being further provided are shown in FIG. 11. Test results of dark current of the photosensitive device in the display backplane in the case where the organic barrier layer is formed (such as SOG (Silicon On Glass) is provided) and in the case where no organic barrier layer is formed (SOG is not provided) are shown in FIG. 12. FIG. 11 is a view of $I_D$-$V_G$ characteristic curves drawn after the testing of different test points. In FIG. 12, voltage $V_{ds}$ denotes voltage between the first electrode and the second electrode and dark current Ids denotes current of the photosensitive sensor.

Figure 3:
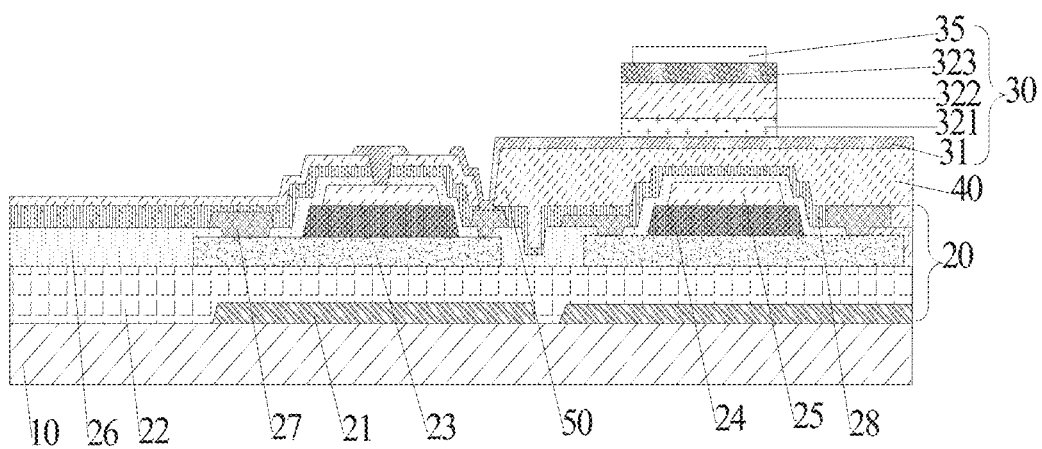
FIG. 3 is a cross-sectional view of a display backplane according to another embodiment of the disclosure.

According to some embodiments of the disclosure, referring to FIG. 2, the organic barrier layer 40 may be disposed only in a partial region under the photosensitive sensor 32. Namely, the organic barrier layer 40 includes a plurality of sub-organic barrier layers and an orthographic projection of each of the sub-organic barrier layers on the substrate covers an orthographic projection of one of the photosensitive sensors 32 on the substrate. According to some other embodiments of the disclosure, referring to FIG. 3, the organic barrier layer 40 may also be an integral layer structure. Namely, an orthographic projection of the organic barrier layer 40 of the integral layer structure on the substrate covers orthographic projections of the photosensitive sensors 32 on the substrate. Specifically, the organic barrier layer 40 can completely cover the thin film transistor under it by the above two arrangements, which prevents H atmosphere during the process of forming the photosensitive device from affecting the electrical properties of the thin film transistor, thus effectively ameliorating the problem of large current of the thin film transistor.

According to an embodiment of the disclosure, referring to FIG. 2, a surface 41 of the organic barrier layer 40 away from the substrate 10 may be a flat plane. Therefore, the problem of dark current caused by the uneven bottom of the photosensitive device can be solved by using the organic barrier layer. Specifically, structures such as metal wiring and via holes are provided under the photosensitive device to form an uneven surface on one side away from the substrate and if the photosensitive device is directly formed on the uneven surface, the dark current may be relatively large, which affects the accuracy of photoelectric detection. The organic barrier layer having a flat surface is provided to allow the photosensitive device to be formed on the flat surface, which effectively reduces the dark current of the photosensitive device.

Figure 5:
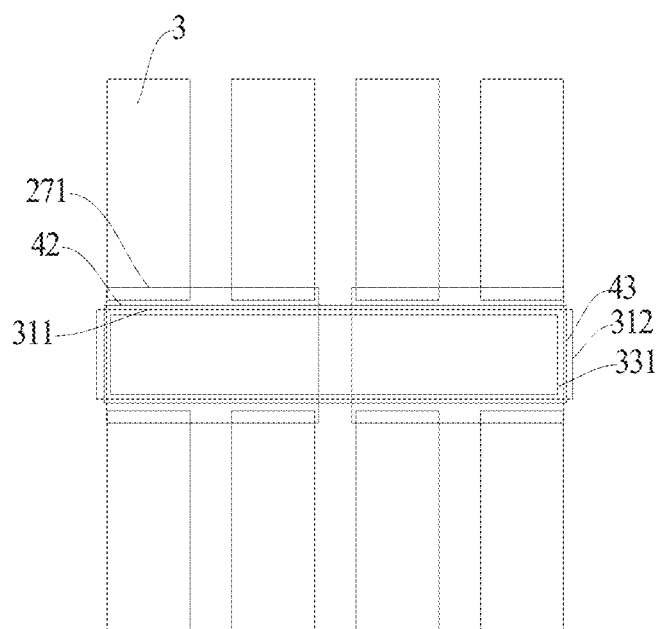
FIG. 5 is a partial plan view of a display backplane according to another embodiment of the disclosure.

According to an embodiment of the disclosure, referring to FIG. 5, the organic barrier layer 40 may be in an elongated shape. An orthographic projection of a long side 42 of the organic barrier layer on the substrate 10 is between an orthographic projection of a side 271 of the source and drain electrodes 27 adjacent to the long side of the organic barrier layer on the substrate and an orthographic projection of a long side 311 of the first electrode 31 on the substrate. An orthographic projection of a short side 43 of the organic barrier layer on the substrate is between an orthographic projection of a short side 312 of the first electrode on the substrate and an orthographic projection of a short side 331 of the second electrode on the substrate. Therefore, it is more beneficial for the implementation of preparation processes. Specifically, the long sides cannot be accurately measured during the test since they are relatively long and it is difficult to solve the problem of the determination of film alignment. Through the above arrangements, if there is any problem in the film alignment can be checked by monitoring the alignment of the short sides during the alignment of mask, which is fast and easier to operate.

According to an embodiment of the disclosure, the organic barrier layer may have a low curing temperature and a high thermal decomposition temperature in order to further reduce the effect of manufacture processes of the photosensitive device on the thin film transistor. In some specific embodiments, the curing temperature of the organic barrier layer may be lower than 260 degrees Celsius (for example, 255 degrees Celsius, 250 degrees Celsius, 245 degrees Celsius, 240 degrees Celsius, 235 degrees Celsius, 230 degrees Celsius, 225 degrees Celsius, 220 degrees Celsius, 215 degrees Celsius, 210 degrees Celsius, etc.). Therefore, the curing process of the organic barrier layer does not have a negative effect on the thin film transistor, which can effectively ameliorate the characteristics of the thin film transistor (TFT), that is, eliminate the problem that the thin film transistor (TFT) becomes abnormal because of large current generated in an environment of temperature higher than 230 degrees Celsius.

In other specific embodiments, the thermal decomposition temperature of the organic barrier layer is greater than 450 degrees Celsius (for example, 455 degrees Celsius, 460 degrees Celsius, 465 degrees Celsius, 470 degrees Celsius, 475 degrees Celsius, 480 degrees Celsius, etc.). Therefore, the organic barrier layer can effectively withstand a high temperature during deposition processes of the photosensitive device without being denatured and decomposed under the deposition temperature condition, thus it has high temperature resistance and good stability. In some specific embodiments, the organic barrier layer may be made of at least one of a polyimide-based material and a silicone-based material. Thus, not only the effect of H on the thin film transistor can be prevented, but also the problem of dark current of the photosensitive device can be effectively alleviated and it is easy to be processed.

According to an embodiment of the disclosure, in order to further enhance the effect of blocking H by the organic barrier layer, an additive for blocking H may be added therein, so that the organic barrier layer performs a superior function of blocking H and water-blocking, thus preventing a large quantity of H from entering the thin film transistor to affect its electrical characteristics during the deposition process of the photosensitive device. Specifically, the additive for blocking H that can be used may be an organic substance. The effect of hydrogen-blocking may be realized through interaction or reaction between organic substances. The specific substance type may be flexibly selected according to the actual needs. For example, it can be a common hydrogen-blocking additive that is commercially available.

According to an embodiment of the disclosure, in order to make it easy to manufacture the organic barrier layer, a photosensitizer may be added to the organic barrier layer, so that the organic barrier layer may enable photosensitization and may be directly formed by operations such as exposure and development with simple and easy steps, high processing precision and high degree of automation. Specifically, the photosensitizer that can be used may be a diazide-based photosensitizer, a cinnamate-based photosensitizer, a polyhydrocarbon-based photosensitizer.

Figure 6:
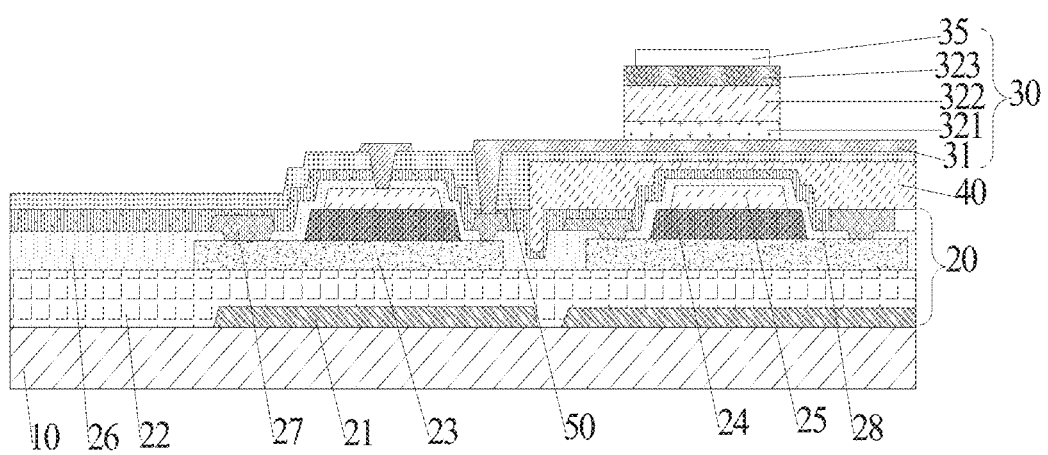
FIG. 6 is a cross-sectional view of a display backplane according to another embodiment of the disclosure.

According to an embodiment of the disclosure, referring to FIG. 6, the display backplane may further include a second inorganic insulating layer 50, which is disposed on one side of the organic barrier layer 40 away from the substrate 10. Therefore, on one hand, the side wall contamination of the photosensitive device caused by the over-etching of the organic barrier layer during the dry etching of the photosensitive device can be avoided; on the other hand, the bonding force between the layer structures can be increased to allow the display backplane to have better reliability and stability.

Figure 7:
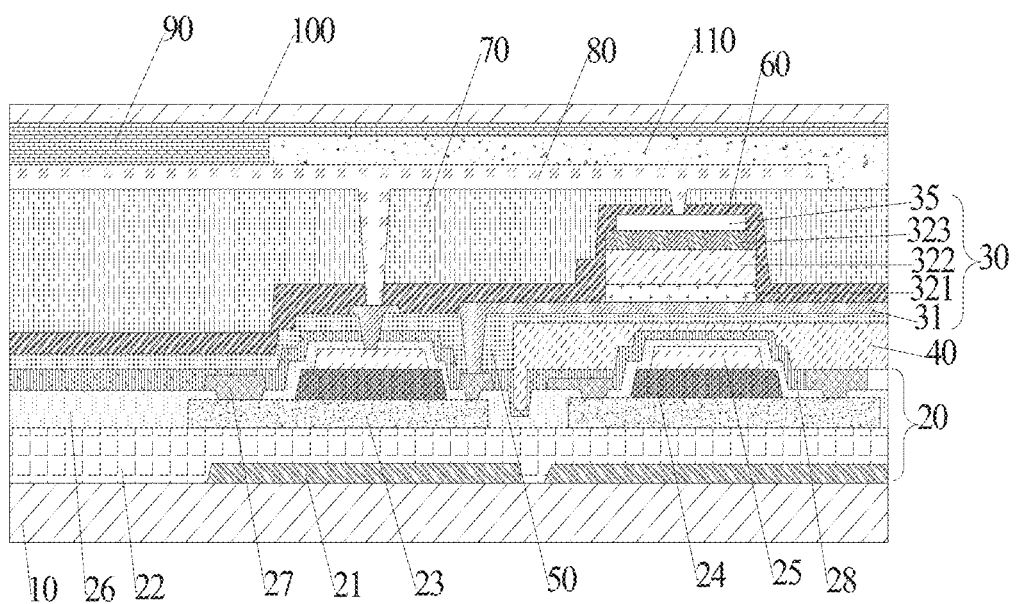
FIG. 7 is a cross-sectional view of a display backplane according to another embodiment of the disclosure.

It can be understood that the display backplane may further include other necessary structures which enable its display function, in addition to the above-mentioned structure. Specifically, referring to FIG. 7, the display backplane may further include a third inorganic insulating layer 60 disposed on one side of the photosensitive device 30 away from the substrate, a resin layer 70 disposed on one side of the third inorganic insulating layer 60 away from the substrate, an anode 80 disposed on one side of the resin layer away from the substrate, a pixel defining layer 110 disposed on the side of the anode 80 and the third inorganic insulating layer 60 away from the substrate, an organic light-emitting layer 90 disposed in an opening of the pixel defining layer and extending to a surface of the pixel defining layer away from the substrate and an anode 100 disposed on one side of the organic light-emitting layer away from the substrate. It should be noted that FIG. 7 only illustrates the structure of the display backplane of the disclosure by way of example and it cannot be interpreted as a limitation on the disclosure. Other changes and modifications may be made within the protection scope of the disclosure without departing from the inventive concept of the disclosure.

In another aspect of the disclosure, the disclosure provides a method of manufacturing the display backplane described above. According to an embodiment of the disclosure, the method includes: forming a thin film transistor structure layer on a substrate; forming a photosensitive device on one side of the thin film transistor structure layer away from the substrate, wherein an interlayer dielectric layer in the thin film transistor structure layer is formed by a deposition manner, and deposition parameters in the deposition manner meet at least one of the following conditions: a parameter of deposition power is 1000-1500 W (such as 1000 W, 1100 W, 1200 W, 1300 W, 1400 W, 1500 W, etc.); a parameter of deposition pressure is 1800-2400 mtorr (1800 mtorr, 1900 mtorr, 2000 mtorr, 2100 mtorr, 2200 mtorr, 2300 mtorr, 2400 mtorr, etc.); and a parameter of deposition time is 220~280 s (such as 220 s, 230 s, 240 s, 250 s, 260 s, 270 s, 280 s, etc.). In this method, the interlayer dielectric layer will have a high compactness by adjusting the parameters for forming the interlayer dielectric layer. Therefore, when the photosensitive device is formed, H in a reaction atmosphere can be effectively blocked by the interlayer dielectric layer from entering an active layer in the thin film transistor, which effectively alleviates the problem of large current of the thin film transistor.

Specifically, the method can only meet any one of the above-mentioned deposition parameters, for example, a deposition power of 1000-1500 W only, or a deposition pressure of 1800-2400 mtorr only, or deposition time of 220-280 s only. The method can only meet any two of the above-mentioned deposition parameters, for example, a deposition power of 1000-1500 W and a deposition pressure of 1800-2400 mtorr, or a deposition power of 1000-1500 W and deposition time of 220~280 s, or a deposition pressure of 1800-2400 mtorr and deposition time of 220~280 s. The method can meet all of the three deposition parameters including a deposition power of 1000-1500 W, a deposition pressure of 1800-2400 mtorr and deposition time of 220-280 s at the same time.

Figure 13:
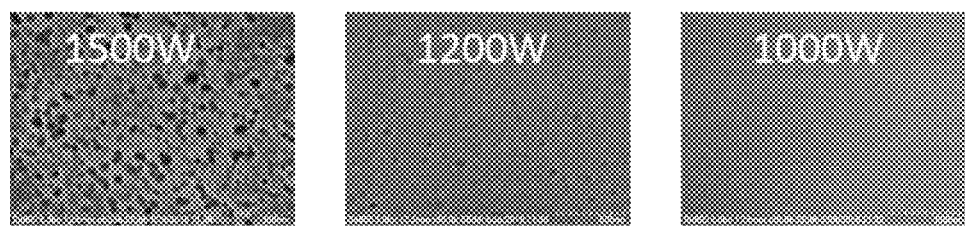
FIG. 13 is a view of stereoscan photographs of an interlayer dielectric layer taken under different deposition power conditions according to an embodiment of the disclosure.

Specifically, stereoscan photographs of the interlayer dielectric layer taken at different deposition power as other parameters remain the same are illustrated in FIG. 13. As can be seen from the drawing, the compactness of the interlayer dielectric layer is significantly increased when the deposition power is 1000-1500 W.

According to an embodiment of the disclosure, the specific structure of the thin film transistor structure layer may be consistent with that described above, which will not be elaborated here. The specific steps and process parameters for forming the thin film transistor structure layer may be performed according to routine techniques. For example, the layer structures may be formed by physical vapor deposition or chemical vapor deposition, more specifically, evaporation and sputtering. The specific steps and parameters may refer to those in conventional processes.

According to an embodiment of the disclosure, the structure and parameters of the photosensitive device may be consistent with those described above, which will not be elaborated herein. In some specific embodiments, the photosensitive sensor in the photosensitive device is a PIN-type photodiode. At this time, the specific steps of forming the photosensitive device may include forming a first electrode layer, an n-type semiconductor layer, an intrinsic semiconductor layer, a p-type semiconductor layer and a second electrode layer, sequentially. The first electrode layer may be formed by a sputtering or deposition method and its specific material may be laminated metal such as Mo/AlNd/Mo, Mo/Cu/Mo. The n-type semiconductor layer, the intrinsic semiconductor layer and the p-type semiconductor layer may be formed by a plasma enhanced chemical vapor deposition (PECVD) method. The second electrode layer may be formed by a sputtering or deposition method and its specific material may be ITO to achieve the photosensitizing effect.

According to an embodiment of the disclosure, after the thin film transistor structure layer is formed and before the photosensitive device is formed, the method may further include forming an organic barrier layer on one side of the thin film transistor structure layer away from the substrate. Specifically, the organic barrier layer may be formed by a coating and patterning method. For example, the organic layer may be coated in photoresist coating processes by an exposure machine, and formed with a desired pattern by being patterned (e.g., a photolithography process), and then cured by an annealing furnace.

According to an embodiment of the disclosure, after the organic barrier layer is formed and before the photosensitive device is formed, the method may further include forming a second inorganic insulating layer on one side of the organic barrier layer away from the substrate. Specifically, the second inorganic insulating layer may be formed by physical vapor deposition or chemical vapor deposition, more specifically, evaporation and sputtering. The specific steps and parameters may refer to those in conventional processes.

In another aspect of the disclosure, the disclosure provides a display backplane. According to an embodiment of the disclosure, referring to FIGS. 1-2, the display backplane includes: a substrate 10; a thin film transistor structure layer 20 disposed on one side of the substrate 10; a photosensitive device 30 disposed on one side of the thin film transistor structure layer 20 away from the substrate 10 and including a photosensitive sensor; and an organic barrier layer 40 disposed between the thin film transistor structure layer 20 and the photosensitive layer 30. The organic barrier layer 40 may be consistent with the foregoing description, which will not be elaborated here. By providing the organic barrier layer in the display backplane, on one hand, H can be effectively blocked from entering a thin film transistor to affect its electrical characteristics. On the other hand, the problem of large dark current of the photosensitive device caused by unevenness under the photosensitive device can be solved.

In still another aspect of the disclosure, the disclosure provides a display device. According to an embodiment of the disclosure, the display device includes the display backplane described above. The display device has good display effect, excellent stability and reliability, and a long service life.

According to an embodiment of the disclosure, the specific type of the display device is not particularly limited, for example, it includes, but not limited to, a mobile phone, a tablet computer, a television, a computer monitor, a game console, a wearable device, and a screen. Further, it should be understood that the display device may further include structures and components necessary for a conventional display device in addition to the above-described display backplane. For example, taking a mobile phone as an example, it may include a touch module, a motherboard, a memory, a camera module, a case, a battery, etc., which will not be elaborated herein.

In the description of the disclosure, it should also be understood that the terms "first" and "second" are only used for the purpose of description and should not be interpreted as indicating or implying relative importance or implicitly indicating the number of the technical features that are described. Therefore, the features defined by "first" and "second" may explicitly or implicitly include one or more of the features. In the description of the disclosure, "a plurality of" means two or more, unless specifically defined otherwise.

In the disclosure, unless otherwise explicitly stated and defined, a first feature "on" or "under" a second feature means direct contact between the first and second features or indirect contact between the first and second features through an intermediate medium. Moreover, the first feature "on," "over," and "above" the second feature means that the first feature is above or right above the second feature, or the first feature has a higher level than that of the second feature. The first feature "below," "under," and "beneath" the second feature means that the first feature is under or below the second feature, or the first feature has a lower level than that of the second feature.

In the description of the specification, the description with reference to the term "one embodiment," "some embodiments," "an example," "a specific example," or "some examples" means that specific features, structures, materials, or characteristics described in conjunction with the embodiments or examples are included in at least one of the embodiments or examples of the disclosure. In this specification, the schematic expression of the above terms is not necessarily directed to the same embodiment or example. Moreover, the described specific features, structures, materials, or characteristics may be combined in the proper way in any one or more of the embodiments or examples. In addition, those skilled in the art could merge and combine different embodiments or examples and features of the different embodiments or examples described in the specification without any contradiction.

Although the embodiments of the disclosure have been shown and described above, it should be understood that the above embodiments are exemplary and should not be construed as limitations on the disclosure. Those skilled in the art could make changes, modifications, substitutions and modifications within the scope of the disclosure.

What is claimed is:

1. A display backplane, comprising:
    a substrate;
    a thin film transistor structure layer disposed on one side of the substrate and comprising a plurality of thin film transistors, a gate insulating layer, and an interlayer dielectric layer, wherein an etching rate of the interlayer dielectric layer carried out under an HF atmosphere condition is less than 2 Å/S; and
    a plurality of photosensitive devices spaced apart from the thin film transistor structure layer and disposed on one side of the thin film transistor structure layer away from the substrate, wherein:
    the photosensitive device comprises a first electrode, a photosensitive sensor, and a second electrode that are stacked up, the first electrode being disposed near the substrate; an orthographic projection of the photosensitive sensor on the substrate falls within an orthographic projection of the first electrode on the substrate; and a gap positioned between an edge of the orthographic projection of the first electrode on the substrate and an edge of the orthographic projection of the photosensitive sensor on the substrate, a width of the gap being equal to or greater than 7 microns, and
    the display backplane meets at least one of the following conditions:
        an orthographic projection of a source electrode of source and drain electrodes in the thin film transistor under the photosensitive device on the substrate and the orthographic projection of the photosensitive sensor on the substrate overlap each other partially, and a gap between an orthographic projection of an edge line on one side of the source electrode away from a drain electrode in the source and drain electrodes on the substrate and an orthographic projection of an edge line on one side of the photosensitive sensor away from the drain electrode on the substrate is equal to or greater than 7 microns; and
        an orthographic projection of the drain electrode of the source and drain electrodes in the thin film transistor under the photosensitive device on the substrate and the orthographic projection of the photosensitive sensor on the substrate overlap each other partially, and a gap between an orthographic projection of an edge line on one side of the drain electrode away from the source electrode of the source and drain electrodes on the substrate and an orthographic projection of an edge line on one side of the photosensitive sensor away from the source electrode on the substrate is equal to or greater than 7 microns.

2. The display backplane according to claim 1, wherein:
    a plurality of spaced-apart sub-pixels are disposed on the display backplane;
    the photosensitive devices are disposed at gaps among the plurality of sub-pixels;
    the photosensitive devices are in an elongated shape; and
    a plurality of sub-pixels are respectively distributed on both sides of the photosensitive devices in a width direction thereof.

3. The display backplane according to claim 1, wherein the photosensitive sensor is a PIN-type photodiode.

4. The display backplane according to claim 2, further comprising:
    an organic barrier layer disposed between the thin film transistor structure layer and the photosensitive device, an orthographic projection of the organic barrier layer on the substrate covering the orthographic projection of the photosensitive sensor on the substrate.

5. The display backplane according to claim 4, wherein the organic barrier layer comprises a plurality of sub-organic barrier layers and an orthographic projection of each of the sub-organic barrier layers on the substrate covers an orthographic projection of one of the photosensitive sensors on the substrate.

6. The display backplane according to claim 4, wherein the organic barrier layer is an integral layer structure and an orthographic projection of the organic barrier layer of the integral layer structure on the substrate covers orthographic projections of the plurality of photosensitive sensors on the substrate.

7. The display backplane according to claim 4, wherein a surface of the organic barrier layer away from the substrate is a flat plane.

8. The display backplane according to claim 4, wherein the organic barrier layer meets at least one of the following conditions:
    a curing temperature lower than 260 degrees Celsius; and
    a thermal decomposition temperature greater than 450 degrees Celsius.

9. The display backplane according to claim 8, wherein the organic barrier layer is made of at least one of a polyimide-based material and a silicone-based material.

10. The display backplane according to claim 4, wherein:
    the organic barrier layer is in an elongated shape;
    an orthographic projection of a long side of the organic barrier layer on the substrate is between an orthographic projection of a side of the source and drain electrodes adjacent to the long side of the organic barrier layer on the substrate and an orthographic projection of a long side of the first electrode on the substrate; and an orthographic projection of a short side of the organic barrier layer on the substrate is between an orthographic projection of a short side of the first electrode on the substrate and an orthographic projection of a short side of the second electrode on the substrate.

11. The display backplane according to claim 4, further comprising:

a second inorganic insulating layer disposed on one side of the organic barrier layer away from the substrate.

12. The display backplane according to claim 1, wherein the display backplane is implemented in a display device.

* * * * *